(12) United States Patent
Chan et al.

(10) Patent No.: US 12,306,550 B2
(45) Date of Patent: May 20, 2025

(54) INNER POD HOLDING DEVICE CONDUCIVE TO REDUCING DUST CONTAMINATION AND OPTICAL INSPECTION APPARATUS FOR INNER POD

(71) Applicant: GUDENG EQUIPMENT CO., LTD., New Taipei (TW)

(72) Inventors: Yin-Feng Chan, New Taipei (TW); Lin-Hsin Tu, New Taipei (TW); Ming-Mo Lo, New Taipei (TW)

(73) Assignee: GUDENG EQUIPMENT CO., LTD., New Taipei (TW)

( * ) Notice: Subject to any disclaimer, the term of this patent is extended or adjusted under 35 U.S.C. 154(b) by 134 days.

(21) Appl. No.: 18/321,799

(22) Filed: May 23, 2023

(65) Prior Publication Data
US 2024/0329544 A1 Oct. 3, 2024

(30) Foreign Application Priority Data
Mar. 30, 2023 (TW) .................................. 112112233

(51) Int. Cl.
*G03F 7/00* (2006.01)
*G01N 21/94* (2006.01)
*G03F 1/66* (2012.01)

(52) U.S. Cl.
CPC .......... *G03F 7/70741* (2013.01); *G01N 21/94* (2013.01); *G03F 1/66* (2013.01);
(Continued)

(58) Field of Classification Search
CPC ....... G01N 21/94; G03F 1/66; G03F 7/70741; G03F 7/70758; G03F 7/7085; G03F 7/70916; G03F 1/62; G03F 1/68; G03F 1/82; G03F 1/84; G03F 7/70483–70541; G03F 7/70605–706851; G03F 7/70691; G03F 7/707; G03F 7/70733;
(Continued)

(56) References Cited

U.S. PATENT DOCUMENTS 4,516,029 A * 5/1985 Tucker .................... H01J 37/20
250/442.11
6,216,873 B1 * 4/2001 Fosnight ................... G03F 1/66
206/454
(Continued)

FOREIGN PATENT DOCUMENTS

WO WO-2018111227 A1 * 6/2018

*Primary Examiner* — Christina A Riddle

(57) ABSTRACT

An inner pod holding device conducive to reducing dust contamination comprises a separator, a plurality of supporters, a first positioning module, and a second positioning module. The separator defines a concealing space and a holding space. The plurality of supporters is disposed in the holding space. The first positioning module includes a first driving member and at least one first positioning member. The first driving member is disposed in the concealing space and configured to move in a first direction. The second positioning module includes a second driving member and at least one second positioning member. The second driving member is disposed in the concealing space and configured to move in a second direction. The first and second positioning members each have a top portion protruding to the holding space. An optical inspection apparatus with the inner pod holding device is further provided.

5 Claims, 3 Drawing Sheets

(52) U.S. Cl.
CPC ........ *G03F 7/70758* (2013.01); *G03F 7/7085* (2013.01); *G03F 7/70916* (2013.01)

(58) Field of Classification Search
CPC .... G03F 7/7075; G03F 7/70775; G03F 7/708; G03F 7/70808; G03F 7/70816; G03F 7/70825; G03F 7/70841; G03F 7/70858; G03F 7/70866; G03F 7/70908; G03F 7/7095; G03F 7/70975; G03F 7/70983; G03F 7/70991; G06K 7/10; G06K 7/10594; G06K 7/10821; G06K 7/10831; G06K 7/10861; G06K 7/1404; G06T 1/0014; H01J 2237/2007; H01J 2237/20221; H01J 37/20; H01L 21/67253; H01L 21/67742
USPC ................ 355/18, 30, 52–55, 67–77; 430/5; 356/237.1–237.6
See application file for complete search history.

(56) References Cited

U.S. PATENT DOCUMENTS

2006/0260978 A1* 11/2006 Gregerson .......... G03F 7/70741
206/710
2019/0033732 A1* 1/2019 Lee ........................... G03F 1/66

* cited by examiner

INNER POD HOLDING DEVICE CONDUCIVE TO REDUCING DUST CONTAMINATION AND OPTICAL INSPECTION APPARATUS FOR INNER POD

CROSS-REFERENCE TO RELATED APPLICATION

This non-provisional application claims priority under 35 U.S.C. § 119(a) on Patent Application No(s). 112112233 filed in Taiwan, R.O.C. on Mar. 30, 2023, the entire contents of which are hereby incorporated by reference.

BACKGROUND OF THE INVENTION

1. Field of the Invention

The present application relates to mask holders, and in particular to an inner pod holding device conducive to reducing dust contamination and an optical inspection apparatus for an inner pod.

2. Description of the Related Art

Advanced lithography processes in semiconductor manufacturing, especially extreme ultraviolet (EUV) lithography processes, have strict requirements for the cleanness of the processing environment. Contamination of masks with particles results in lithography processing defects. Reticle pods are generally effective in fending off external particles to meet the need for mask cleanness and protection. Therefore, cleanliness is of vital importance to reticle pods used in EUV lithography processes, especially inner pods in direct contact with masks.

Therefore, it is necessary to inspect inner pods to ensure the cleanness of inner pods. Conventional inner pod inspections have a drawback that poses a risk to inner pods. An inspection apparatus has to move and position an inner pod while performing an inspection on the inner pod. However, the movement is likely to cause the generation of dust because of friction.

BRIEF SUMMARY OF THE INVENTION

In view of the drawbacks of the conventional inner pod inspections, it is an objective of the present application to provide an inner pod holding device conducive to reducing dust contamination.

To achieve the above and other objectives, the present application provides an inner pod holding device conducive to reducing dust contamination, comprising: a separator for defining a concealing space and a holding space; a plurality of supporters being disposed in the holding space and each having a bottom portion and a top portion, the bottom portions being connected to the separator, and the top portions being coplanar; a first positioning module comprising a first driving member and at least one first positioning member, the first driving member being disposed in the concealing space and configured to move in a first direction, wherein the at least one first positioning member has a bottom portion connecting to the first driving member and a top portion protruding to the holding space; and a second positioning module comprising a second driving member and at least one second positioning member, the second driving member being disposed in the concealing space and configured to move in a second direction, wherein the at least one second positioning member has a bottom portion connecting to the second driving member and a top portion protruding to the holding space, wherein a coplanar plane defined by the first direction and the second direction is parallel to the coplanar plane defined by the top portions of the plurality of supporters.

In an embodiment of the present application, the inner pod holding device conducive to reducing dust contamination further comprises an aligning center disposed in the holding space.

In an embodiment of the present application, the inner pod holding device conducive to reducing dust contamination further comprises a tactile sensor disposed in the holding space.

In an embodiment of the present application, the inner pod holding device conducive to reducing dust contamination further comprises an optical sensor disposed in the holding space.

The present application further provides an optical inspection apparatus for an inner pod, comprising: the inner pod holding device conducive to reducing dust contamination; an optical photographic device facing the holding space; and a control device electrically coupled and being in signal connection with the optical photographic device, the first driving member, and the second driving member.

Therefore, an inner pod holding device conducive to reducing dust contamination and an optical inspection apparatus for an inner pod according to the present application are characterized by a separator for defining a concealing space and a holding space, with the inner pod under test being disposed in the holding space, and characterized by movable members, namely a first driving member and a second driving member. The movable members, which are likely to cause dust contamination, are concealed in the concealing space to reduce dust contamination, thereby enhancing the cleanness of the inner pod and the reliability of inner pod inspections.

DETAILED DESCRIPTION OF THE INVENTION

The present application is illustrated with specific embodiments, depicted with accompanying drawings, and described below so as for persons skilled in the art to fully understand the present application, especially the objectives, features, and advantages of the present application. The present application can be implemented or applied in accordance with any other specific embodiments. Details presented herein may be modified and changed from different perspectives and for different applications without departing from the spirit of the present application. The embodiments presented below are further descriptive of the technical features of the present application rather than restrictive of the claims of the present application.

Figure 1A:
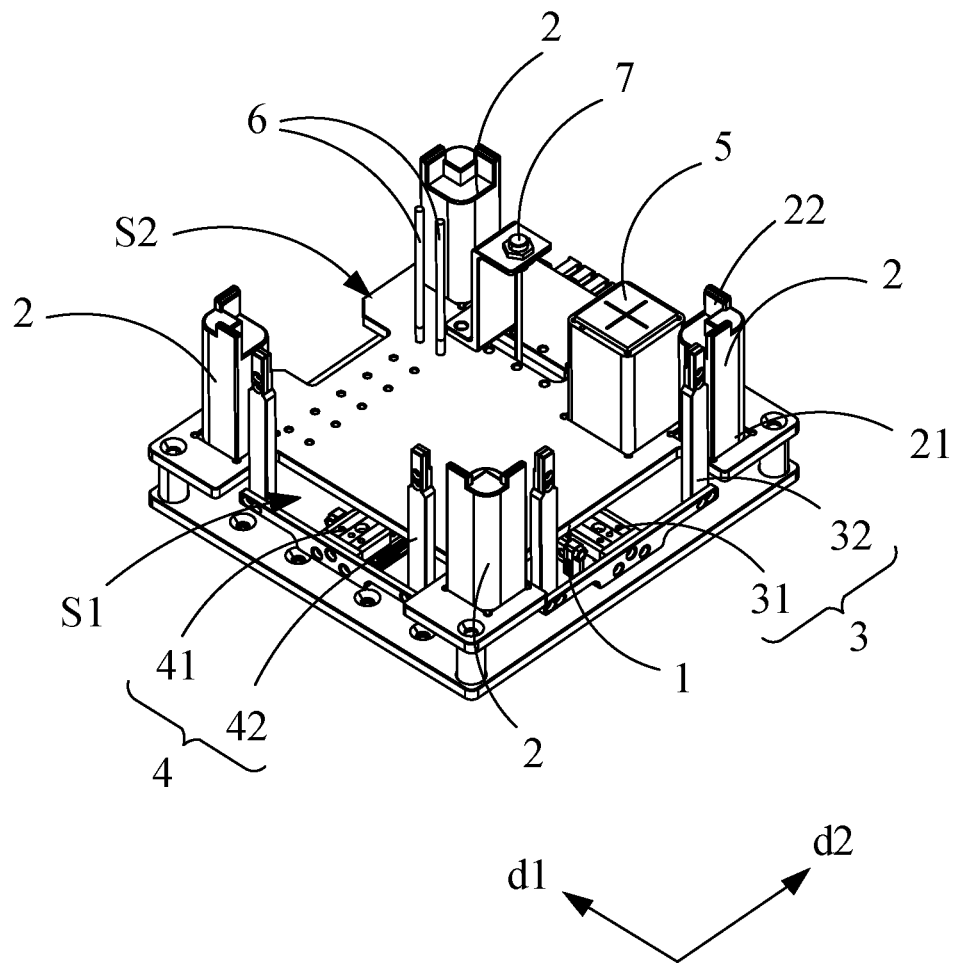
FIG. 1A is a schematic perspective view of an inner pod holding device conducive to reducing dust contamination according to an embodiment of the present application.
Figure 1B:
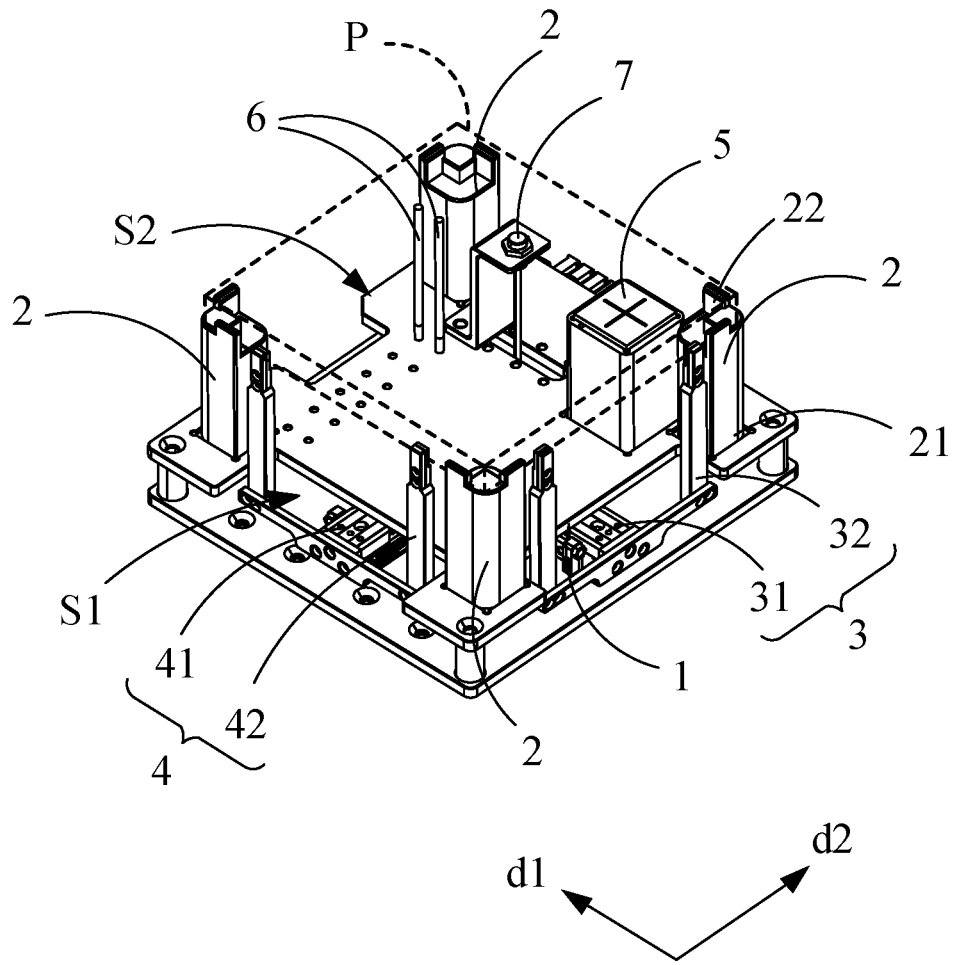
FIG. 1B is a schematic view of how to hold an inner pod according to an embodiment of the present application.

As shown in FIG. 1A and FIG. 1B, an inner pod holding device 100 conducive to reducing dust contamination according to an embodiment of the present application comprises a separator 1, a plurality of supporters 2, a first positioning module 3, and a second positioning module 4.

The separator 1 defines a concealing space S1 and a holding space S2. Preferably, the concealing space S1 is disposed under the separator 1 in the gravity direction, and the holding space S2 is disposed over the separator 1 in the gravity direction; however, the present application is not limited thereto. In an embodiment, the separator 1 is plate-shaped and flat; however, the present application is not limited thereto. In some embodiments, the separator 1 has a rough, rugged surface or is a box capable of covering the underlying the first positioning module 3 and the second positioning module 4.

The plurality of supporters 2 are disposed in the holding space S2. Bottom portions 21 of the plurality of supporters 2 are connected to the separator 1. Top portions 22 of the plurality of supporters 2 are coplanar. As shown in FIG. 1B, the top portions 22 are in contact with an inner pod P so that the inner pod P lies on the coplanar plane and thereby is supported by the plurality of supporters 2. The plurality of supporters 2 is in a quantity of three or above and is, in an embodiment, in a quantity of four to support the four corners of the inner pod P. However, the present application is not limited thereto. In other embodiments, the number and positions of the plurality of supporters 2 are subject to changes as needed.

The first positioning module 3 comprises a first driving member 31 and at least one first positioning member 32. The first driving member 31 is disposed in the concealing space S1 and configured to move in a first direction d1. The first driving member 31 is, for example, a servo motor, a cylinder, or a mechanism capable of transmitting a linear driving force. The at least one first positioning member 32 is slender. The bottom portion of the at least one first positioning member 32 is connected to the first driving member 31. The top portion of the at least one first positioning member 32 protrudes to the holding space S2. The at least one first positioning member 32 assists with the positioning of the inner pod P in the first direction d1. Since the position of the first driving member 31 is adjustable in the first direction d1, the at least one first positioning member 32 can position the inner pod P. In an embodiment, the first positioning module 3 comprises two first positioning members 32, and the bottom portions of the two first positioning members 32 are connected to the first driving member 31 and driven by the first driving member 31. The two first positioning members 32 are parallel to augment the effective positional limitation on the inner pod P. However, the present application is not limited thereto. In other embodiments, the shape and number of the first positioning members 32 are subject to changes as needed. In an embodiment, the first positioning module 3 is disposed on one side of the separator 1. However, in other embodiments, two first positioning modules 3 flank the separator 1.

Similarly, the second positioning module 4 comprises a second driving member 41 and at least one second positioning member 42. The second driving member 41 is disposed in the concealing space S1 and configured to move in a second direction d2. The second driving member 41 is, for example, a servo motor, a cylinder, or a mechanism capable of transmitting a linear driving force. The at least one second positioning member 42 is slender. The bottom portion of the at least one second positioning member 42 is connected to the second driving member 41. The top portion of the at least one second positioning member 42 protrudes to the holding space S2. The at least one second positioning member 42 assists with the positioning of the inner pod P in the second direction d2. Since the position of the second driving member 41 is adjustable in the second direction d2, the at least one second positioning member 42 can position the inner pod P. In an embodiment, the second positioning module 4 comprises two second positioning members 42. The bottom portions of the two second positioning members 42 are connected to the second driving member 41 and driven by the second driving member 41. The two second positioning members 42 are parallel to augment the effective positional limitation on the inner pod P. However, the present application is not limited thereto. In other embodiments, the shape and number of the second positioning members 42 are subject to changes as needed. In an embodiment, the second positioning module 4 is disposed on one side of the separator 1. However, in other embodiments, the separator 1 is flanked by two second positioning modules 4.

The coplanar plane defined by the first direction d1 and the second direction d2 is parallel to the coplanar plane defined by the top portions 22 of the plurality of supporters 2. Therefore, the moving/positioning directions of both the first positioning module 3 and the second positioning module 4 are restricted to the plane on which the inner pod P lies, and thus the first positioning module 3 and the second positioning module 4 synergistically impose positional limitation on the inner pod P in two directions on the plane. In an embodiment, the first direction d1 and the second direction d2 are perpendicular to each other and are on the X-axis and the Y-axis, respectively, wherein the Z-axis is the gravity direction. However, the present application is not limited thereto. In other embodiments, the first direction d1 and the second direction d2 are not necessarily perpendicular to each other and not necessarily perpendicular to the gravity direction.

As mentioned above, the separator 1 defines the concealing space S1 and the holding space S2, and the inner pod P under test is disposed in the holding space S2. Movable members, namely the first driving member 31 and the second driving member 32, are likely to cause dust contamination but are advantageously concealed in the concealing space S1 to reduce dust contamination, thereby enhancing the cleanness of the inner pod P and the reliability of inner pod inspections.

Furthermore, in an embodiment, the inner pod holding device 100 conducive to reducing dust contamination further comprises an aligning center 5 disposed in the holding space S2. The aligning center 5 can be read by an external device to determine whether the external device is aligned with the inner pod holding device 100, or whether the position of the inner pod holding device 100 has to be changed. In an embodiment, the aligning center 5 is cruciform in shape so that the extension directions of the two perpendicular lines of the cross of the cruciform shape are aligned with the first direction d1 and the second direction d2, respectively; however, the present application is not limited thereto.

Furthermore, in an embodiment, the inner pod holding device 100 conducive to reducing dust contamination further comprises a tactile sensor 6 disposed in the holding space S2. The tactile sensor 6 is adapted to come into contact with the bottom of the inner pod P to determine whether the inner pod P is in place. The tactile sensor 6 is, for example, a mechanical sensor, an electromagnetic sensor, or a piezoelectric sensor, but the present application is not limited thereto.

Furthermore, in an embodiment, the inner pod holding device 100 conducive to reducing dust contamination further comprises an optical sensor 7 disposed in the holding space S2. The optical sensor 7 optically determines whether the inner pod P is in place. The optical sensor 7 determines whether the inner pod P is present in the holding space S2, using reflected rays or incident rays of an infrared detector.

Figure 2:
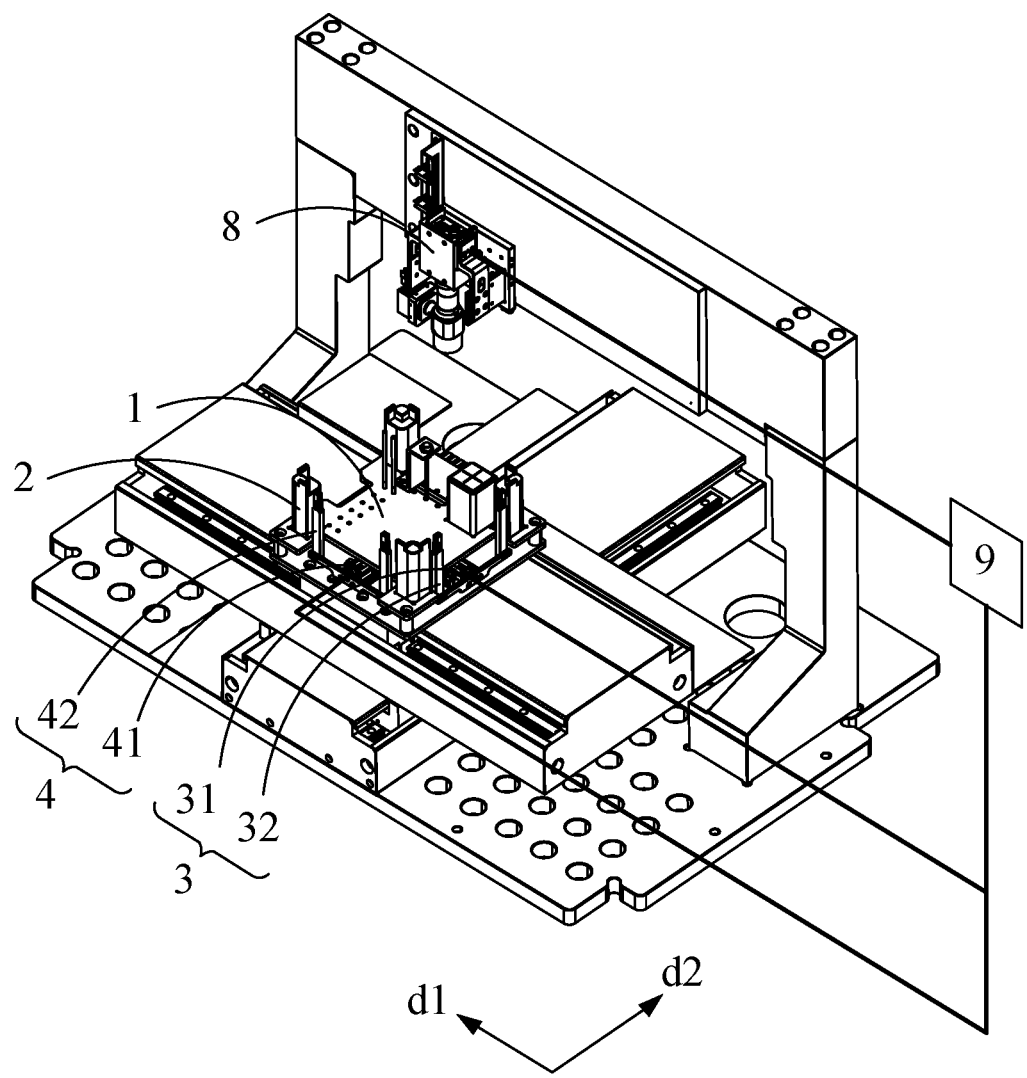
FIG. 2 is a schematic perspective view of an optical inspection apparatus for an inner pod according to an embodiment of the present application.

Furthermore, as shown in FIG. 2, the present application further provides an optical inspection apparatus for an inner pod, comprising the inner pod holding device 100 conducive to reducing dust contamination, an optical photographic device 8, and a control device 9.

The lens of the optical photographic device 8 faces the holding space S2 to capture images of the inner pod P.

The control device 9 is electrically coupled to the optical photographic device 8, the first driving member 31, and the second driving member 41. The control device 9 is, for example, a control circuit or a control chip with a decision logic circuit. The control device 9 controls the optical photographic device 8 to align with the inner pod P in the holding space S2 to capture images of the inner pod P and perform an optical inspection thereof. The control device 9 further controls the first driving member 31 and the second driving member 41 to move in the first direction d1 and the second direction d2, respectively, and thereby adjust the positioning of the inner pod P.

The present invention is disclosed above by embodiments. However, persons skilled in the art should understand that the embodiments are illustrative of the invention only, but shall not be interpreted as restrictive of the scope of the invention. Hence, all equivalent modifications and replacements made to the aforesaid embodiments shall be deemed falling within the scope of the claims of the invention. Accordingly, the legal protection for the present invention shall be defined by the appended claims.

What is claimed is:

1. An inner pod holding device conducive to reducing dust contamination, comprising:
    a separator for defining a concealing space and a holding space;
    a plurality of supporters being disposed in the holding space and each having a bottom portion and a top portion, the bottom portions being connected to the separator, and the top portions being coplanar;
    a first positioning module comprising a first driving member and at least one first positioning member, the first driving member being disposed in the concealing space and configured to move in a first direction, wherein the at least one first positioning member has a bottom portion connecting to the first driving member and a top portion protruding to the holding space; and
    a second positioning module comprising a second driving member and at least one second positioning member, the second driving member being disposed in the concealing space and configured to move in a second direction, wherein the at least one second positioning member has a bottom portion connecting to the second driving member and a top portion protruding to the holding space;
    wherein a coplanar plane defined by the first direction and the second direction is parallel to the coplanar plane defined by the top portions of the plurality of supporters.

2. The inner pod holding device conducive to reducing dust contamination according to claim 1, further comprising an aligning center disposed in the holding space.

3. The inner pod holding device conducive to reducing dust contamination according to claim 1, further comprising a tactile sensor disposed in the holding space.

4. The inner pod holding device conducive to dust reducing contamination according to claim 1, further comprising an optical sensor disposed in the holding space.

5. An optical inspection apparatus for an inner pod, comprising:
    the inner pod holding device conducive to reducing dust contamination according to claim 1;
    an optical photographic device facing the holding space; and
    a control device electrically coupled to the optical photographic device, the first driving member, and the second driving member.

* * * * *